United States Patent
Lee

(10) Patent No.: US 7,633,086 B2
(45) Date of Patent: Dec. 15, 2009

(54) LIGHT EMITTING DEVICE

(75) Inventor: Chun Tak Lee, Gumi (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/373,338

(22) Filed: Mar. 13, 2006

(65) Prior Publication Data

US 2006/0284168 A1   Dec. 21, 2006

(30) Foreign Application Priority Data

Jun. 15, 2005   (KR)   .................. 10-2005-0051380
Jun. 15, 2005   (KR)   .................. 10-2005-0051396

(51) Int. Cl.
*H01L 35/24* (2006.01)
(52) U.S. Cl. .................. 257/40; 257/70; 257/99; 257/764; 257/770; 257/E51.018; 257/E51.019; 257/E51.02; 257/E51.021; 257/E51.022
(58) Field of Classification Search .............. 257/81, 257/735, 100, 211, 40, 79, 99, 764, 770, 257/E51.018–E22; 438/26, 106, 121, 125
See application file for complete search history.

(56) References Cited

U.S. PATENT DOCUMENTS

| | | | |
|---|---|---|---|
| 2005/0110020 A1* | 5/2005 | Hayashi et al. | 257/72 |
| 2005/0195355 A1* | 9/2005 | Kwak et al. | 349/149 |
| 2005/0248012 A1* | 11/2005 | Furihata | 257/678 |
| 2006/0157836 A1* | 7/2006 | Park et al. | 257/678 |

FOREIGN PATENT DOCUMENTS

KR   10-2004-0100006 A   12/2004

* cited by examiner

*Primary Examiner*—Kiesha L. Rose
*Assistant Examiner*—Minchul Yang
(74) *Attorney, Agent, or Firm*—Morgan Lewis & Bockius LLP

(57) ABSTRACT

A light emitting device is disclosed which includes a substrate, a plurality of anode electrode layers disposed in a first direction on the substrate, a plurality of cathode electrode layers disposed in a second direction different from the first direction on the substrate, a plurality of data lines electrically communicated with the anode electrode layers, and a plurality of scan lines electrically communicated with the cathode electrode layers.

20 Claims, 4 Drawing Sheets

LIGHT EMITTING DEVICE

BACKGROUND OF THE INVENTION

1. Field of the Invention

The present invention relates to a light emitting device, particularly to an organic electroluminescent device, in which a part of data lines and scan lines includes a first conduction layer and an insulation layer formed on a substrate in sequence.

2. Description of the Related Art

An organic electroluminescent device is a device emitting a light having a predetermined wavelength when a certain voltage is applied thereto.

FIG. 1A is a plane view of an organic electroluminescent device in the art. And, FIG. 1B is a sectional view of a data line cut along by line I-I' of FIG. 1A.

In FIG. 1A, the organic electroluminescent device in the art includes a cell part 100, data lines 108, and scan lines 110a, 110b.

The cell part 100 includes anode electrode layers 102, and cathode electrode layers 104 crossing them.

A plurality of pixels 106 are formed on an emitting area that the anode electrode layers 102 cross the cathode electrode layers 104.

The data lines 108 each are connected to the anode electrode layers 102 to provide data signals transmitted from an integrated circuit chip (not shown) to the anode electrode layers 102.

Also, each data line 108 includes Indium Tin Oxide layer 122 (ITO layer, below) and a sub-electrode layer 124, for example, molybdenum layer, formed on the substrate 120 in sequence as shown in FIG. 1B.

The scan lines 110a, 110b each are connected to the cathode electrode layers 104 and transmit the scan signals transmitted from the integrated circuit chip to the cathode electrode layers 104.

A sealing area 112 is an area on which a sealing agent is spread, for example, a sealant.

In particular, a cell cap is bonded with the substrate 120 by the sealing agent in the sealing area 112.

As a result, the cell part 100 is sealed.

In short, in the organic electroluminescent device in the art, each data line 108 includes the ITO layer 122 and the sub-electrode layer 124 formed on the substrate 120 in sequence. The sub-electrode layer 124 is consisted of molybdenum (Mo).

In the case, moisture permeates between the ITO layer 122 and the sub-electrode layer 124 because the sub-electrode layer 124 is formed on the top of the ITO layer 122 as shown in FIG. 1B.

Thus, the ITO layer 122 and the sub-electrode layer 124 may be oxidized.

Also, in case the cell cap is bonded with the substrate 120 in the sealing area 112, moisture can be permeated into the cell cap through the data lines 108 because the sub-electrode layer 124 included in the data lines 108 cannot prevent permeation of moisture.

As a result, the pixels 106 could be defective.

Therefore, there has been a need for an organic electroluminescent device including the data lines and the scan lines that can prevent oxidation and permeation of moisture.

SUMMARY OF THE INVENTION

One object of the present invention is to solve at least one of the above problems and/or disadvantages and to provide at least one advantage described hereinafter.

Another object of the present invention is to provide a light emitting device that can prevent oxidation of data lines and scan lines.

Another object of the present invention is to provide a light emitting device that can prevent moisture or impurities from permeating into a cell cap.

In accordance with a first embodiment of the present invention, the light emitting device includes a substrate, a plurality of anode electrode layers disposed in a first direction on the substrate, a plurality of cathode electrode layers disposed in a second direction different from the first direction on the substrate, a plurality of data lines electrically communicated with the anode electrode layers, and a plurality of scan lines electrically communicated with the cathode electrode layers. A part of at least one line of the data lines and the scan lines includes a first conduction layer and an insulation layer formed over the substrate, and the other part of the line includes the first conduction layer and a second conduction layer formed over the substrate, wherein the second conduction layer covers the first conduction layer.

The organic electroluminescent device according to a second embodiment of the present invention includes anode electrode layers and cathode electrode layers crossing them, a plurality of data lines electrically communicated with the anode electrode layers, and a plurality of scan lines electrically communicated with the cathode electrode layers. A part of a sealing area of at least one line of the data lines and the scan lines includes an indium tin oxide (ITO) layer and an insulation layer formed over a substrate.

The organic electroluminescent device according to a third embodiment of the present invention includes anode electrode layers and cathode electrode layers crossing them, a plurality of data lines electrically communicated with the anode electrode layers, and a plurality of scan lines electrically communicated with the cathode electrode layers. A part of a sealing area of at least one line of the data lines and the scan lines includes a metal layer and an insulation layer formed over a substrate.

As described above, the light emitting device of the present invention can prevent moisture from permeating into a cell cap because a part of a sealing area in each of the data lines and scan lines includes an insulation layer formed on the first conduction layer.

Also, the light emitting device of the present invention can prevent oxidation of the first conduction layer and the second conduction layer because the second conduction layer covers the first conduction layer in the part of the data lines and the scan lines.

BRIEF DESCRIPTION OF THE DRAWINGS

The present invention will be described in detail with reference to the following drawings in which same reference numerals are used to refer to same elements wherein.

DESCRIPTION OF EMBODIMENTS

Hereinafter, preferred embodiments of the present invention will be explained in more detail with reference to the accompanying drawings.

Figure 1A:
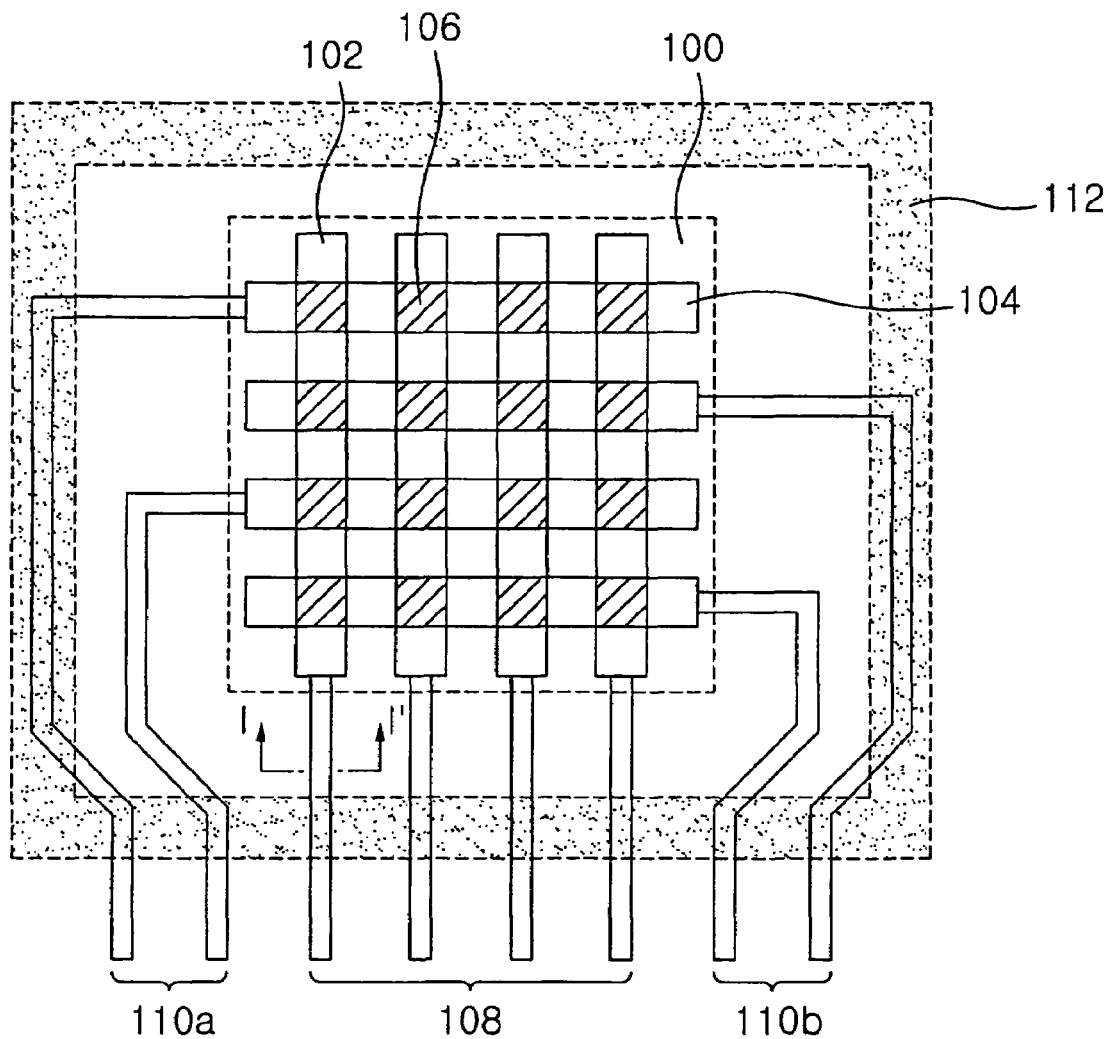
FIG. 1A is a plane view of an organic electroluminescent device in the art.
Figure 1B:
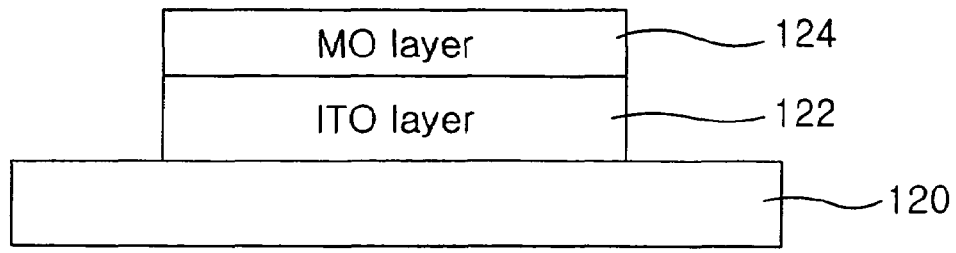
FIG. 1B is a sectional view of a data line cut along by line I-I' of FIG. 1A.
Figure 2:
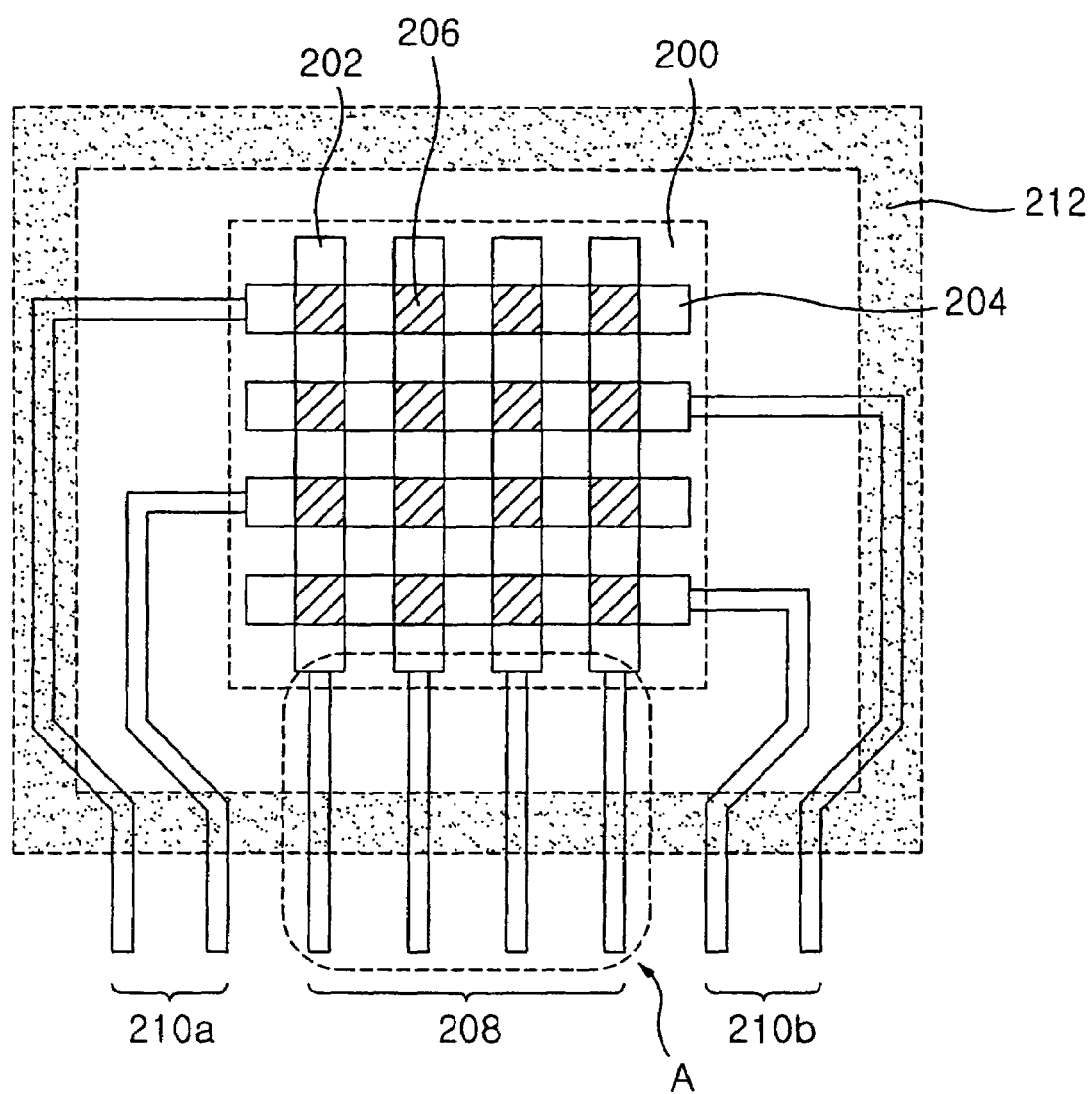
FIG. 2 is a plane view of the organic electroluminescent device according to one embodiment of the present invention.

FIG. 2 is a plane view of the organic electroluminescent device according to one embodiment of the present invention.

In FIG. 2, the organic electroluminescent device according to one embodiment of the present invention includes a cell part 200, data lines 208, and scan lines 210a, 210b.

The cell part 200 includes anode electrode layers 202 and cathode electrode layers 204 crossing them.

Each of the anode electrode layers 202 according to one embodiment of the present invention consists of an indium tin oxide layer 202 (ITO layer, below).

A plurality of pixels 206 are formed on emitting areas crossing over the anode electrode layers 202 and the cathode electrode layers 204.

Each of the pixels 206 consists of an anode electrode layer 202, an organic layer, and an cathode electrode layer 204, deposited on the substrate in sequence.

The organic layer includes a hole transporting layer (HTL), an emitting layer (EML), and an electron transporting layer (ETL), deposited on the anode electrode layer 202 in sequence.

The data lines 208 each are electrically communicated with the anode electrode layers 202 to provide data signals transmitted from an integrated circuit chip to the anode electrode layers 202.

The scan lines 210a, 210b are electrically communicated with the cathode electrode layers 204 to provide scan signals transmitted from an integrated circuit chip to the cathode electrode layers 204.

The scan lines according to another embodiment of the present invention may be connected to the cathode electrode layers in the same direction.

A sealing area 212 is an area on which a sealing agent is spread, for example, a sealant.

In particular, a cell cap is bonded with the substrate by the sealing agent in the sealing area 212.

As a result, the cell part 200 is sealed.

Figure 3:
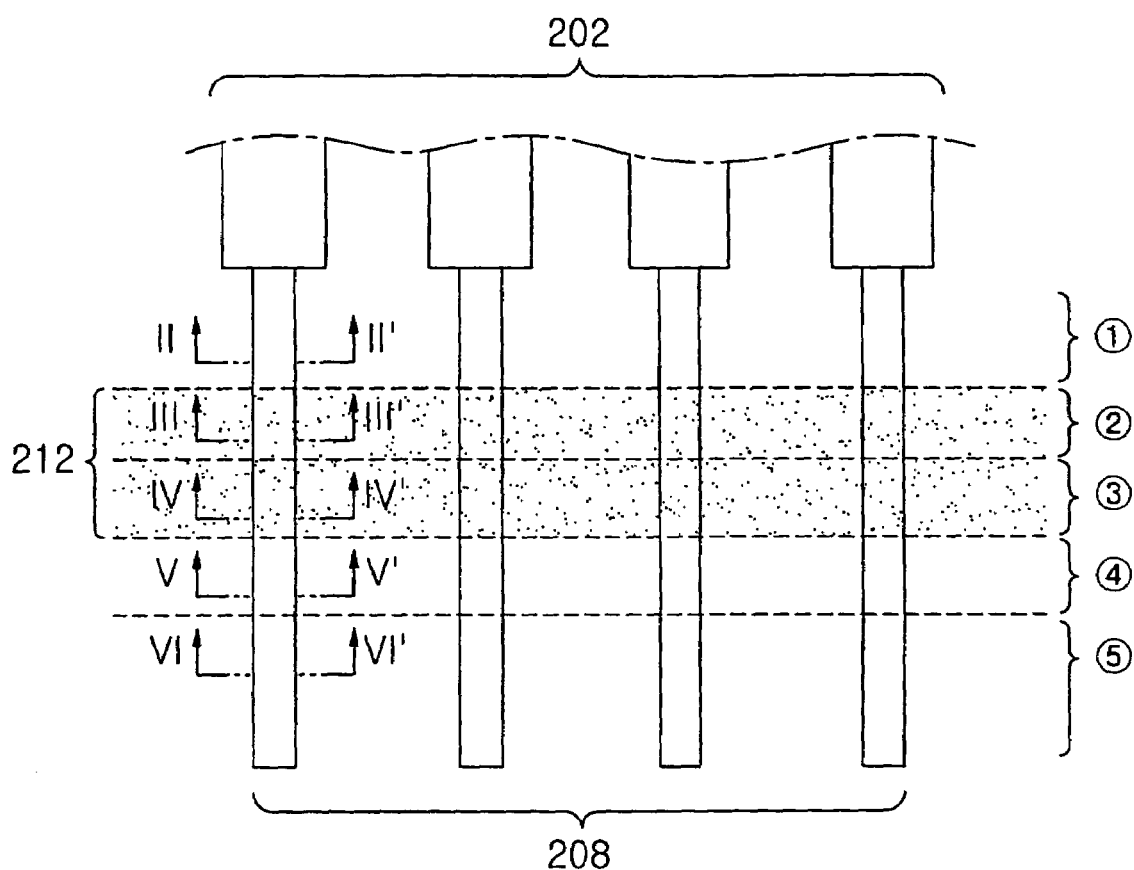
FIG. 3 is a plane view illustrating enlarged part A in FIG. 2.
Figure 4A:
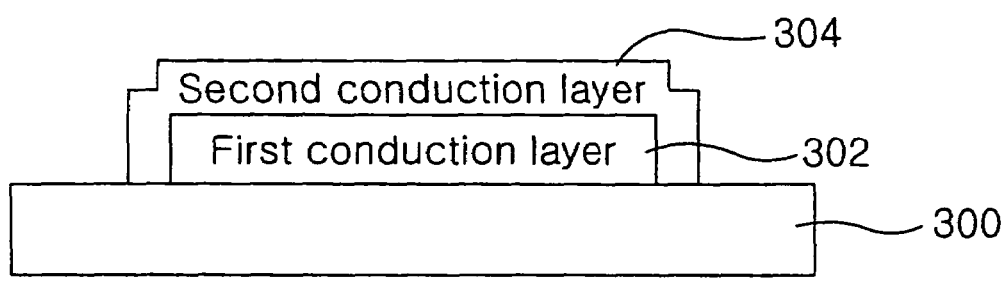
FIG. 4A is a sectional view of a data line cut along by line II-II', III-III' or VI-VI' of FIG. 3.

FIG. 3 is a plane view illustrating enlarged part A in FIG. 2. FIG. 4A is a sectional view of a data line cut along by line II-II', III-III' or VI-VI' of FIG. 3. And, FIG. 4B is a sectional view of a data line cut along by line IV-IV' or V-V' of FIG. 3.

Figure 4B:
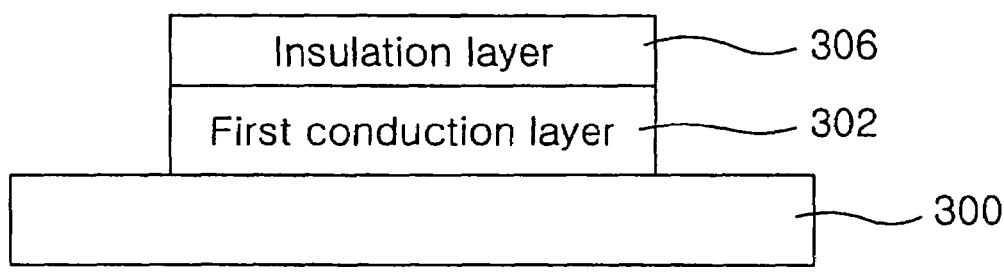
FIG. 4B is a sectional view of a data line cut along by IV-IV' or V-V' line of FIG. 3.

In FIG. 3, FIG. 4A, and FIG. 4B, each of the data lines 208 consists of different components depending on the area.

An area corresponding to the sealing area 212 in each of the data lines 208 is divided into two areas.

In detail, a part of an area corresponding to the sealing area 212 in each of the data lines 208 includes the first conduction layer 302 and the insulation layer 306 formed on the substrate 300 in sequence as shown in FIG. 4B.

For example, area ③ in the sealing area 212 consists of the first conduction layer 302 and the insulation layer 306 formed in sequence.

Here, the insulation layer 306 can prevent permeation of moisture, etc.

In detail, when the cell cap is bound with the substrate 300 in the sealing area 212, moisture cannot permeate into the cell cap by the insulation layer 306.

As a result, the pixels 206 are protected from moisture, etc.

Also, the substrate 300 can be bound with the cell cap more strongly because the transmittance of the insulation layer 306 is better than that of the second conduction layer 304 consisted of a metal.

In detail, the substrate 300 and the cell cap are bound by curing the sealing agent through irradiating UV to the sealing agent after the sealing agent is applied to the sealing area 212.

In this case, the UV is irradiated to the sealing agent through the substrate 300 and the data lines 208. Thus, the better the transmittance of the data lines is, the better the sealing agent is cured.

Therefore, in case the data lines 208 include the insulation layer 306 instead of the sub-electrode layer consisted of a metal, the substrate 300 is better bound with the cell cap.

On the other hand, the other part of the area corresponding to the sealing area 212 in each data line, that is, area ②, consists of the first conduction layer 302 formed on the substrate 300 and the second conduction layer 304 covering the first conduction layer 302 as shown in FIG. 4A.

In the organic electroluminescent device according to another embodiment of the present invention, all the area corresponding to the sealing area in each of the data lines may consist of a first conduction layer and an insulation layer deposited on the substrate in sequence.

Only, in case of forming the area ② in the sealing area 212 as the first conduction layer 302 and the second conduction layer 304, the resistance of the data lines 208 can be smaller.

The area ① in the data lines 208 consists of the first conduction layer 302 formed on the substrate 300 and the second conduction layer 304 covering the first conduction layer 302, as shown in FIG. 4A.

The area ④ in the data lines 208 consists of the first conduction layer 302 and the insulation layer 306 formed on the substrate 300 in sequence as shown in FIG. 4B.

As a result, the alignment error between the substrate 300 and the cell cap is corrected.

In detail, the substrate 300 and the cell cap cannot be bound exactly in the sealing area 212, and may be bound in a part of the sealing area 212 and a part of the area ④.

In this case, since the area ④ in the data lines 208 consists of the first conduction layer 302 and the insulation layer 306 formed on the substrate 300 in sequence, moisture, etc. cannot permeate into the cell cap.

That is, the area ④ does play a role to correct an error that may be occurred by inexact alignment of the substrate 300 and the cell cap.

Area ⑤ in the data lines 208 consists of the first conduction layer 302 formed on the substrate 300 and the second conduction layer 304 covering the first conduction layer 302, as shown in FIG. 4A.

Here, because the second conduction layer 304 covers the first conduction layer 302, moisture cannot permeate between the first conduction layer 302 and the second conduction layer 304.

As a result, the first conduction layer 302 and the second conduction layer 304 are not oxidized.

In short, the areas ③ and ④ in the data lines 208 according to the organic electroluminescent device of the present invention consists of the first conduction layer 302 and the insulation layer 306 unlike the data lines in an organic electroluminescent device in the art.

Thus, the organic electroluminescent device according to the present invention can prevent permeation of moisture into the cell part 200 unlike one in the art.

Also, the area ⑤ in the data lines 208 according to the organic electroluminescent device of the present invention consists of the first conduction layer 302 and the second conduction layer 304 covering the first conduction layer 302, unlike the data lines according to one in the art.

Thus, the organic electroluminescent device according to the present invention can prevent oxidization of the first conduction layer 302 and the second conduction layer 304, unlike one in the art.

The first conduction layer 302 according to the first embodiment of the present invention consists of an electric conductor, for example, ITO, and the second conduction layer 304 consists of a metal, for example, Mo.

The first conduction layer 302 according to the second embodiment of the present invention consists of a metal for example, Mo, and the second conduction layer 304 consists of an electric conductor, for example, ITO.

And, all the above are exemplified for the data line, but can be applied to the scan line in the same way.

From the preferred embodiments of the present invention, it is noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. A light emitting device in which a cell cap is bonded with a substrate by a sealant in a sealing area, the light emitting device comprising:
   a plurality of anode electrode layers disposed in a first direction on the substrate;
   a plurality of cathode electrode layers disposed in a second direction different from the first direction on the substrate;
   a plurality of data lines electrically communicated with the anode electrode layers; and
   a plurality of scan lines electrically communicated with the cathode electrode layer,
   wherein the data line includes a first part and a second part disposed in the sealing area, respectively, wherein the first part of the data line comprises a first conduction layer and an insulation layer directly contacted to the sealant, wherein the second part of the data line comprises the first conduction layer and a second conduction layer, and wherein the second part of the data line is disposed to be coupled with the first part of the data line in a remaining part of the sealing area.

2. The light emitting device of claim 1, wherein the light emitting device is an organic electroluminescent device.

3. The light emitting device of claim 1, wherein a resistance of the first conduction layer is different from a resistance of the second conduction layer.

4. The light emitting device of claim 1, wherein the first conduction layer is made of indium tin oxide, and the second conduction layer is made of Mo.

5. The light emitting device of claim 1, wherein the first conduction layer is made of metal, and the second conduction layer is made of indium tin oxide.

6. The light emitting device of claim 1, wherein the first part of the data line is disposed in a part of an outer area of the sealing area.

7. An organic electroluminescent device in which a cell cap is bonded with a substrate by a sealant in a sealing area, having anode electrode layers and cathode electrode layers crossing each other, the organic electroluminescent device comprising:
   a plurality of data lines electrically communicated with the anode electrode layers; and
   a plurality of scan lines electrically communicated with the cathode electrode layers,
   wherein the data line includes a first part and a second part disposed in the sealing area, respectively, wherein the first part of the data line comprises a first conduction layer made of indium tin oxide and an insulation layer directly contacted to the sealant, wherein the second part of the data line comprises the first conduction layer and a second conduction layer made of metal, and wherein the second part of the data line is disposed to be coupled with the first part of the data line in a remaining part of the sealing area.

8. The organic electroluminescent device of claim 7, wherein the first part of the data line is disposed in a part of an outer area of the sealing area.

9. An organic electroluminescent device in which a cell cap is bonded with a substrate by a sealant in a sealing area, having anode electrode layers and cathode electrode layers crossing each other, the organic electroluminescent device comprising:
   a plurality of data lines electrically communicated with the anode electrode layers; and
   a plurality of scan lines electrically communicated with the cathode electrode layers,
   wherein the data line includes a first part and a second part disposed in the sealing area, respectively, wherein the first part of the data line comprises a first conduction layer made of metal and an insulation layer directly contacted to the sealant, wherein the second part of the data line comprises the first conduction layer and a second conduction layer made of indium tin oxide, and wherein the second part of the data line is disposed to be coupled with the first part of the data line in a remaining part of the sealing area.

10. The organic electroluminescent device of claim 9, wherein the first part of the data line is disposed in a part of an outer area of the sealing area.

11. A light emitting device in which a cell cap is bonded with a substrate by a sealant in a sealing area, the light emitting device comprising:
    a plurality of anode electrode layers disposed in a first direction on the substrate;
    a plurality of cathode electrode layers disposed in a second direction different from the first direction on the substrate;
    a plurality of data lines electrically communicated with the anode electrode layers; and
    a plurality of scan lines electrically communicated with cathode electrode layer,
    wherein the scan line includes a first part and a second part disposed in the sealing area, respectively, wherein the first part of the scan line comprises a first conduction layer and an insulation layer directly contacted to the sealant, wherein the second part of the scan line comprises the first conduction layer and a second conduction layer, and wherein the second part of the scan line is disposed to be coupled with the first part of the scan line in a remaining part of the sealing area.

12. The light emitting device of claim 11, wherein the light emitting device is an organic electroluminescent device.

13. The light emitting device of claim 11, wherein a resistance of the first conduction layer is different from a resistance of the second conduction layer.

14. The light emitting device of claim 11, wherein the first conduction layer is made of indium tin oxide, and the second conduction layer is made of Mo.

15. The light emitting device of claim 11, wherein the first conduction layer is made of metal, and the second conduction layer is made of indium tin oxide.

16. The light emitting device of claim 11, wherein the first part of the scan line is disposed in a part of an outer area of the sealing area.

17. An organic electroluminescent device in which a cell cap is bonded with a substrate by a sealant in a sealing area, having anode electrode layers and cathode electrode layers crossing each other, the organic electroluminescent device comprising:

a plurality of data lines electrically communicated with the anode electrode layers; and a plurality of scan lines electrically communicated with cathode electrode layers, wherein the scan line includes a first part and a second part disposed in the sealing area, respectively, wherein the first part of the scan line comprises a first conduction layer made of indium tin oxide and an insulation layer directly contacted to the sealant, wherein the second part of the scan line comprises the first conduction layer and a second conduction layer made of metal, and wherein the second part of the scan line is disposed to be coupled with the first part of the scan line in a remaining part of the sealing area.

18. The organic electroluminescent device of claim 17, wherein the first part of the scan line is disposed in a part of an outer area of the sealing area.

19. An organic electroluminescent device in which a cell cap is bonded with a substrate by a sealant in a sealing area, having anode electrode layers and cathode electrode layers crossing each other, the organic electroluminescent device comprising:

a plurality of data lines electrically communicated with the anode electrode layers; and a plurality of scan lines electrically communicated with the cathode electrode layers, wherein the scan line includes a first part and a second part disposed in the sealing area, respectively, wherein the first part of the scan line comprises a first conduction layer made of metal and an insulation layer directly contacted to the sealant, wherein the second part of the scan line comprises the first conduction layer and a second conduction layer made of indium tin oxide, and wherein the second part of the scan line is disposed to be coupled with the first part of the scan line in a remaining part of the sealing area.

20. The organic electroluminescent device of claim 19, wherein the first part of the scan line is disposed in a part of an outer area of the sealing area.

* * * * *